(12) United States Patent
Park et al.

(10) Patent No.: US 11,599,167 B2
(45) Date of Patent: Mar. 7, 2023

(54) HEAT RADIATING MEMBER AND DISPLAY DEVICE INCLUDING THE SAME

(71) Applicant: Samsung Display Co., Ltd., Yongin-Si (KR)

(72) Inventors: Youngok Park, Seoul (KR); Junwoo You, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/377,717

(22) Filed: Jul. 16, 2021

(65) Prior Publication Data

US 2022/0043492 A1 Feb. 10, 2022

(30) Foreign Application Priority Data

Aug. 7, 2020 (KR) ........................ 10-2020-0099281

(51) Int. Cl.
*G06F 1/20* (2006.01)
*H05K 7/20* (2006.01)
*G06F 1/16* (2006.01)

(52) U.S. Cl.
CPC ............ *G06F 1/203* (2013.01); *G06F 1/1652* (2013.01); *H05K 7/20963* (2013.01)

(58) Field of Classification Search
CPC ...... G06F 1/203; G06F 1/1652; G06F 1/1637; G06F 1/20; H05K 7/20963; H05K 7/2039; H05K 7/20954
See application file for complete search history.

(56) References Cited

U.S. PATENT DOCUMENTS

| 4,341,980 A * | 7/1982 | Noguchi | H01J 29/467 313/422 |
| 7,814,566 B2 * | 10/2010 | Chen | G03F 7/405 430/311 |
| 9,961,809 B1 * | 5/2018 | Yoon | H01L 23/3735 |
| 2008/0032437 A1 * | 2/2008 | Sugimoto | G03F 7/70433 438/57 |
| 2008/0205000 A1 * | 8/2008 | Ye | G11B 33/1426 361/709 |
| 2011/0061848 A1 * | 3/2011 | Chiou | H01L 23/3733 165/185 |

(Continued)

FOREIGN PATENT DOCUMENTS

| KR | 100615282 B1 | 8/2006 |
| KR | 100637435 B1 | 10/2006 |

(Continued)

OTHER PUBLICATIONS

C.A. Hoffman et al., "Semimetal-to-semiconductor transition in bismuth thin films," Physical Review B, 1993, 4 pages. vol. 48, No. 15.

(Continued)

*Primary Examiner* — Abhishek M Rathod
(74) *Attorney, Agent, or Firm* — Cantor Colburn LLP

(57) ABSTRACT

A heat radiating member includes bismuth. The heat radiating member defines a plurality of holes therein, and the plurality of holes is separated from each other in a plan view. Separation distances between the plurality of holes in the plan view each are more than about 40 nm and equal to or less than about 150 nm.

18 Claims, 9 Drawing Sheets

(56) References Cited

U.S. PATENT DOCUMENTS

| | | | | |
|---|---|---|---|---|
| 2016/0055793 | A1* | 2/2016 | Jang | B32B 5/18 |
| | | | | 428/408 |
| 2017/0139123 | A1* | 5/2017 | Ochi | G02F 1/133308 |
| 2017/0186992 | A1* | 6/2017 | Lee | H01L 51/529 |
| 2018/0146579 | A1* | 5/2018 | Kim | H05K 13/04 |
| 2019/0058150 | A1* | 2/2019 | Lee | F28F 21/02 |

FOREIGN PATENT DOCUMENTS

| | | |
|---|---|---|
| KR | 1020140033566 A | 3/2014 |
| KR | 1020140052457 A | 5/2014 |
| KR | 102104331 B1 | 4/2020 |
| WO | 2015105161 A1 | 7/2015 |

OTHER PUBLICATIONS

Farzan Gity et al., "Reinventing solid state electronics: Harnessing quantum confinement in bismuth thin films," Applied Physics Letters, 2017, vol. 110, pp. 093111-093111-5.

G. Zhou et al., "Semimetal to semiconductor transition and thermoelectric properties of bismuth nanotubes," Journal of Applied Physics, 2011, 8 pages, American Institute of Physics.

Jeongmin Kim et al., "Diameter-dependent thermoelectric figure of merit in single-crystalline Bi nanowires," Nanoscale, 2015, 7 pages, The Royal Society of Chemistry.

Jeongmin Kim et al., "Observation of anisotropy in thermoelectric properties of individual single-crystalline bismuth nanowires," Journal of Applied PHYSICs, 2017, 6 pages, AIP Publishing.

Kai Liu et al., "Finite-size effects in bismuth nanowires," Physical Review B, 1998, 4 pages, vol. 58, No. 22, The American Physical Society.

Seunghyun Lee et al., "Direct observation of the semimetal-to-semiconductor transition of individual single-crystal bismuth nanowires grown by on-film formation of nanowires," Nanotechnology, 2010, 6 pages, IOP Publishing Ltd.

M.S. Dresselhaus, Solid State Physics Part 1, Transport Properties of Solids, Fall, 2001, Lecture Note, 233 Pages.

Park, et al., Quantum confinement effect in Bi anti-dot thin films with tailored pore wall widths and thicknesses, AIP Applied Physics Letters, 104, 023106 (2014), 5 Pages.

Tang, et al., Electronic phases, band gaps, and band overlaps of bismuth antimony nanowires, Physical Review B 89, 045424 (2014), 7 Pages.

* cited by examiner

HEAT RADIATING MEMBER AND DISPLAY DEVICE INCLUDING THE SAME

This application claims priority to Korean Patent Application No. 10-2020-0099281, filed on Aug. 7, 2020, and all the benefits accruing therefrom under 35 U.S.C. § 119, the content of which in its entirety is herein incorporated by reference.

BACKGROUND

The present disclosure herein relates to a heat radiating member and a display device including the same, and more particularly, to a heat radiating member having a nanometer-scale length and a display device including the same.

In recent years, as various electronic devices such as TVs, laptops, and mobile phones are being miniaturized and their performances are being improved at a remarkable speed, the capacities of electronic components built therein are increasing and the electronic components are being highly integrated. Accordingly, the components of electronic devices generate a lot of heat. The heat generated in electronic devices may shorten the service life of a product or cause the failure and malfunction of components. Therefore, studies are being conducted on measures to discharge heat, generated inside electronic devices, to the outside.

SUMMARY

The present disclosure provides a heat radiating member having a reduced thickness and exhibiting a good thermal diffusion characteristic.

The present disclosure also provides a display device having a good thermal diffusion characteristic by including a heat radiating member with a reduced thickness.

An embodiment of the inventive concept provides a heat radiating member including bismuth, where each of separation distances between adjacent holes among a plurality of holes defined in the heat radiating member and separated from each other is more than about 40 nanometers (nm) and equal to or less than about 150 nm in a plan view.

In an embodiment, an average thickness of the heat radiating member in a thickness direction may be about 25 nm or more and less than about 40 nm.

In an embodiment, each of the plurality of holes may have, in the plan view, a circular or polygonal shape.

In an embodiment, the plurality of holes in the plan view may each be circular, and the average diameters of the plurality of holes may be different from each other.

In an embodiment, each of the plurality of holes may be quadrilateral in the plan view, and sizes of the plurality of holes may be different from each other.

In an embodiment, each of the plurality of holes in the plan view may have a regular hexagonal shape, and distances between center points of the adjacent holes in the plan view may be the same. The center points may be virtual points passing through centers of the adjacent holes, respectively.

In an embodiment, the separation distances between the adjacent holes among the plurality of holes may be different from each other.

In an embodiment, a total area of the plurality of holes may be about 14 percentages (%) or more and less than about 40% of a total area of the heat radiating member including the plurality of holes in the plan view.

An embodiment of the inventive concept provides a display device, including: a display panel; and a heat radiating member having bismuth, disposed below the display panel, and defining a plurality of holes therein and which are separated from each other, where separation distances between adjacent holes among the plurality of holes in a plan view each are more than about 40 nanometers (nm) and equal to or less than about 150 nm.

In an embodiment, the plurality of holes may each be cylinders or polygonal columns. and each of the plurality of holes may be defined to penetrate the heat radiating member.

In an embodiment, an average thickness of the heat radiating member in a thickness direction may be about 25 nm or more and less than about 40 nm.

In an embodiment, a support member disposed below the display panel may be further included, and the support member may include at least one of copper or graphite.

In an embodiment, the support member may be disposed below the heat radiating member.

In an embodiment, the display panel may include a bending part and a non-bending part, and the heat radiating member may overlap the non-bending part and non-overlap the bending part in the plan view.

In an embodiment, an area of the display panel and an area of the heat radiating member including the plurality of holes in the plan view may be the same.

In an embodiment, an adhesive layer disposed between the display panel and the heat radiating member may be further included.

In an embodiment, the adhesive layer may contain epoxy, acrylate, or silicone.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
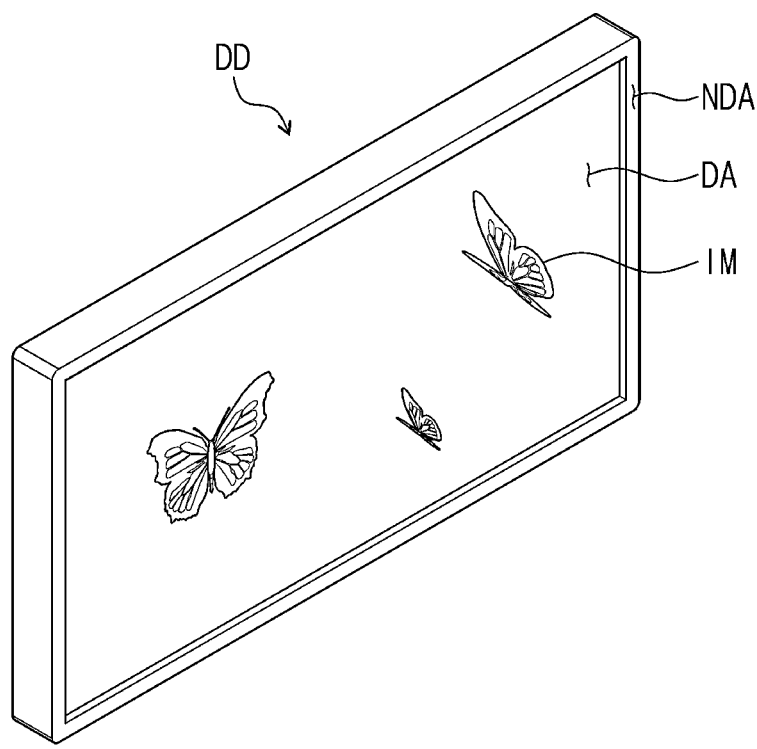
FIG. 1 is a perspective view illustrating a display device of one embodiment.
Figure 1:
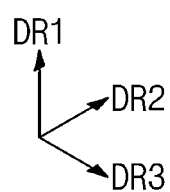

In the present invention, various changes and modifications may be made and various forms may be applied, and specific embodiments are illustrated in the drawings and will be described in detail in this specification. However, the present invention should not be limited to these specific exemplary embodiments and it will be understood that all changes, modifications, equivalents, and substitutes included in the spirit and scope of the present invention should be included herein.

It will be understood that when an element (area, layer, portion, or the like) is referred to as being "on", "connected to" or "coupled to" another element, it can be directly on, connected or coupled to the other element or intervening elements may be present.

Like reference numerals refer to like elements throughout. The thickness and the ratio and the dimension of the element are exaggerated for effective description of the technical contents.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention. Similarly, a second element, component, region, layer or section could be termed a first element, component, region, layer or section. As used herein, the singular forms, "a", "an" and "the" are intended to include the plural forms as well, unless the context clearly indicates otherwise.

Besides, spatially relative terms, such as "below", "lower", "above", "upper" and the like, may be used herein for ease of description to describe one element or feature's relationship to another element(s) or feature(s) as illustrated in the figures. The terms used herein are relative concepts and described on the basis of directions in the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include" or "have", when used in this specification, specify the presence of stated features, integers, steps, operations, elements, components and/or groups thereof, but do not preclude the presence or addition of one or more other features, integers, steps, operations, elements, components, and/or groups thereof.

Hereinafter, a heat radiating member and a display device including the same according to exemplary embodiments of the inventive concept will be explained in detail with reference to the accompanying drawings.

FIG. 1 illustrates a display device according to an embodiment. The display device DD illustrated in FIG. 1 may be a large display device such as a television, a monitor, or an external billboard. The display device DD may be a device activated in response to an electrical signal. The display device DD may include various examples. For example, the display device DD may be a personal computer, a laptop computer, a personal digital terminal, a vehicle navigation unit, a game machine, a smart phone, a tablet computer, a camera or the like. These are only presented as examples. Thus, other display devices may be employed without departing from the concept of the present invention.

In the display device DD, a display area DA and a non-display area NDA may be defined. The display area DA may be an area in which an image IM is displayed. FIG. 1 illustrates butterflies as an example of an image IM. The non-display area NDA may be an area where an image IM is not displayed. The display area DA may be parallel to a plane defined by a first direction axis DR1 and a second direction axis DR2 crossing the first direction axis DR1.

In this specification, an upper surface (in other words, front surface) and a lower surface (in other words, rear surface) of each member are defined on the basis of a direction where an image IM is displayed (i.e., third direction axis DR3). The upper and lower surfaces may face each other along a third direction axis DR3, and a normal direction of each of the upper and lower surfaces may be parallel to the third direction axis DR3. As used herein, "plan view" is a view shown in the direction of the third direction axis DR3. However, directions indicated by the first to third direction axes DR1, DR2, and DR3 are relative concepts and may thus be changed into other directions. Hereinafter, the first to third directions are the directions indicated by the first to third direction axes DR1, DR2, and DR3, respectively, and denoted as like reference symbols.

Figure 2:
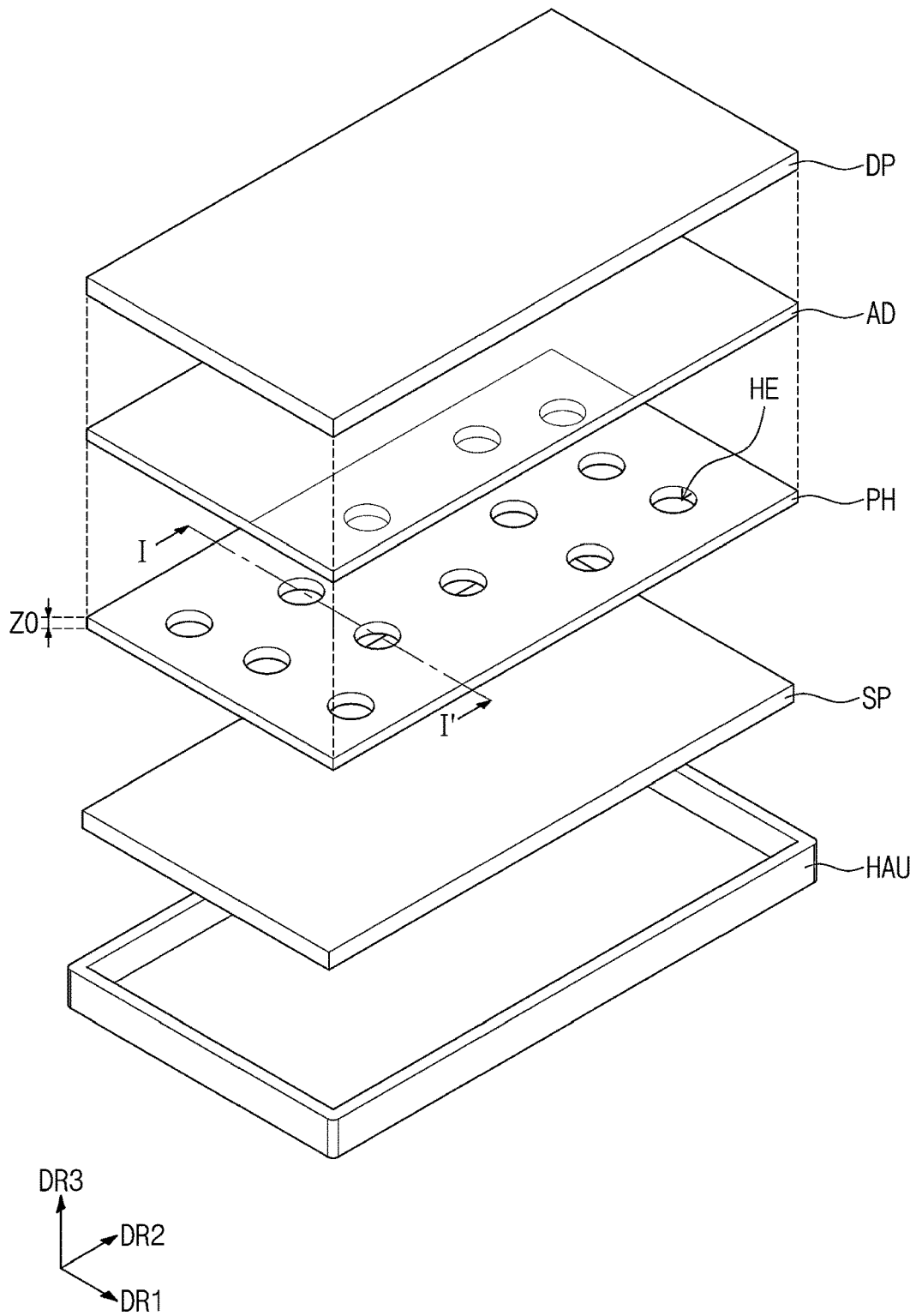
FIG. 2 is an exploded perspective view illustrating a display device of one embodiment.
Figure 3:
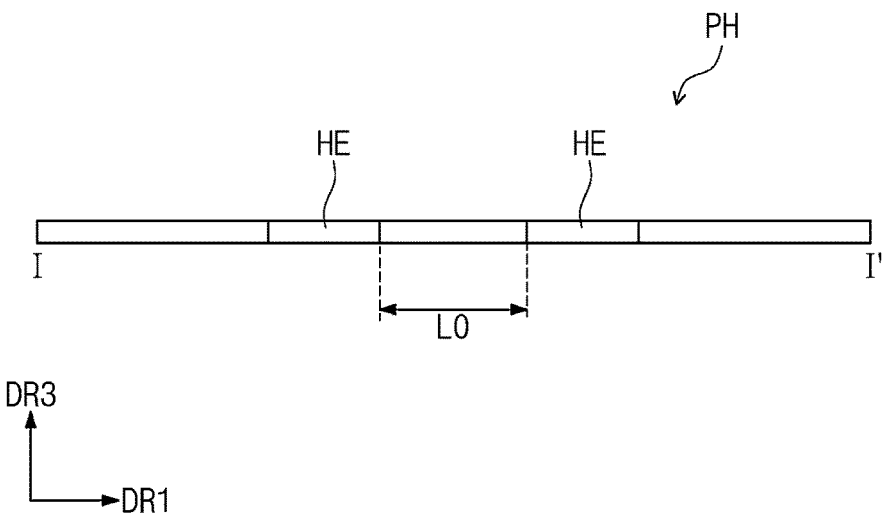
FIG. 3 is a cross-sectional view illustrating a portion taken along line I-I' of FIG. 2.
Figure 4:
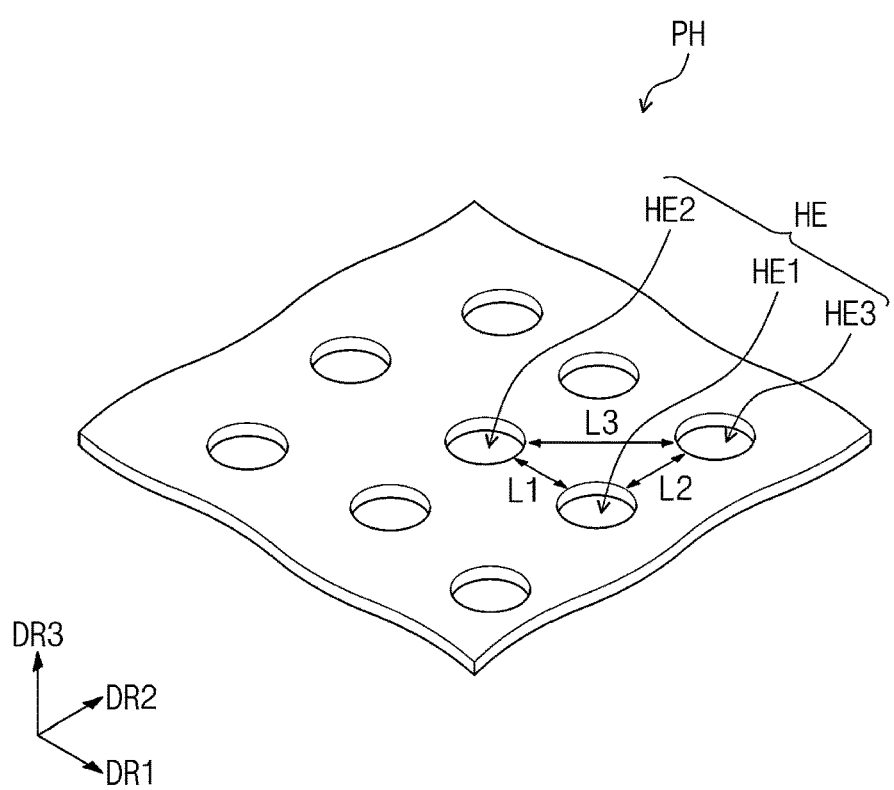
FIG. 4 is a perspective view illustrating a heat radiating member of one embodiment.
Figure 5:
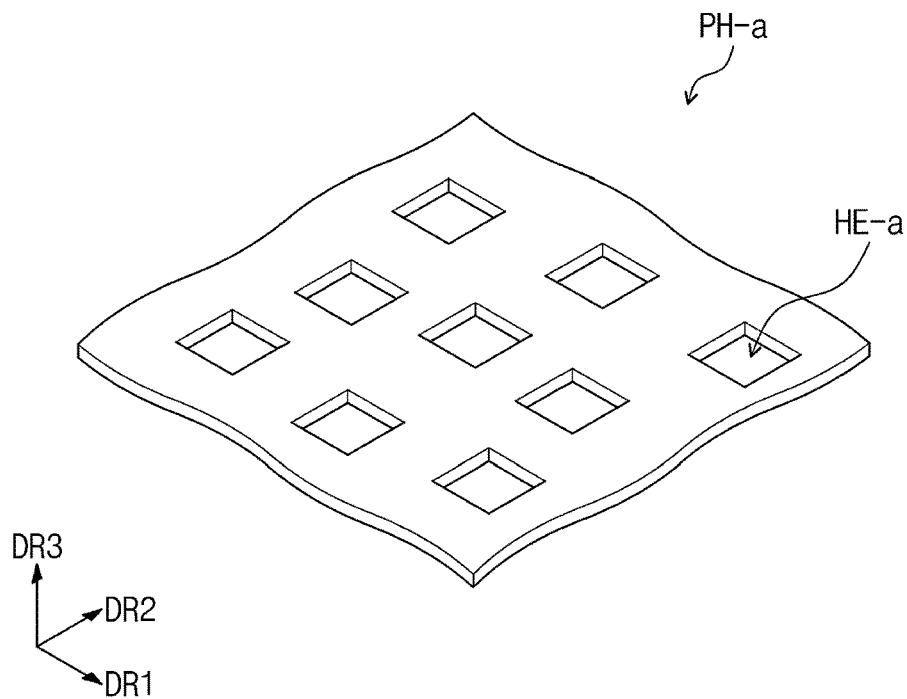
FIG. 5 is a perspective view illustrating a heat radiating member of one embodiment.
Figure 6:
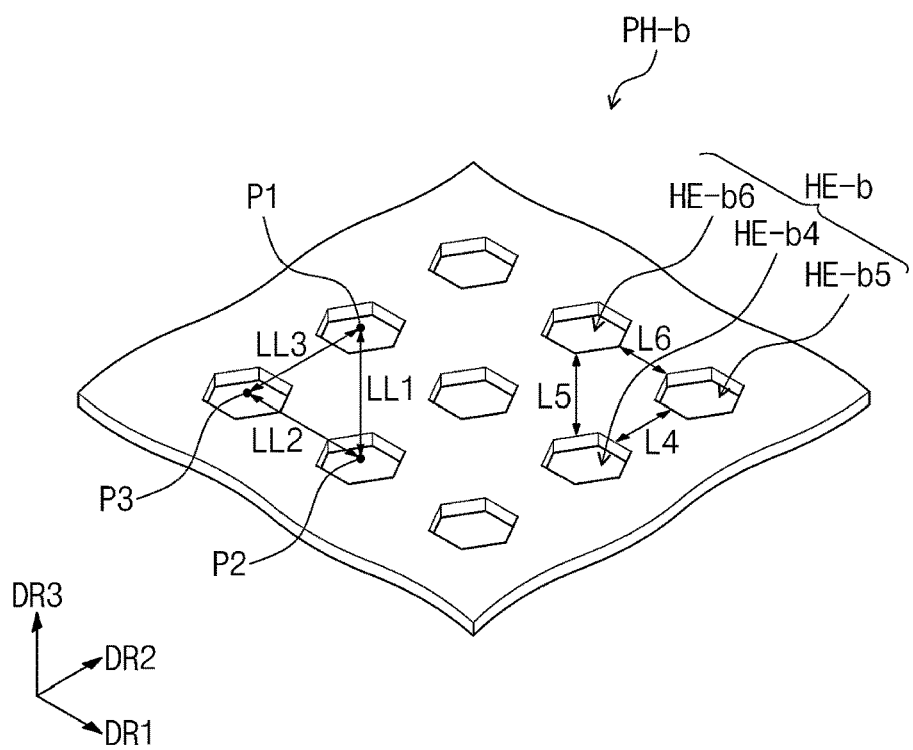
FIG. 6 is a perspective view illustrating a heat radiating member of one embodiment.

FIG. 2 is an exploded perspective view illustrating a display device according to an embodiment. FIG. 3 is a cross-sectional view illustrating a portion taken along line I-I' of FIG. 2. FIG. 4 illustrates a heat radiating member according to an embodiment. FIGS. 5 and 6 illustrate heat radiating members according to other embodiments of the inventive concept.

Referring to FIG. 2, a display device DD of an embodiment may include a display panel DP and a heat radiating member PH. The heat radiating member PH may be disposed below the display panel DP. In addition, the display device DD may include an adhesive layer AD, disposed between the display panel DP and the heat radiating member PH, and a housing HAU disposed below the heat radiating member PH. The adhesive layer AD may adhere the display panel DP to the heat radiating member PH. The adhesive layer AD may contain epoxy, acrylate, or silicone. However, these are just exemplary, and materials included in the adhesive layer AD according to the invention are not limited thereto.

The display panel DP, the adhesive layer AD, and the heat radiating member PH included in the display device DD of an embodiment may be housed in the housing HAU. The housing HAU may include a material having relatively high rigidity. For example, the housing HAU may include a plurality of frames and/or plates which are composed of glass, plastic, or metal. The housing HAU provides a predetermined housing space. The display panel DP may be housed in the housing space of the housing HAU so as to be protected from an external shock.

In an embodiment of the inventive concept, various display panels such as a liquid crystal display panel, an electrophoresis display panel, or a light-emitting-type display panel which is capable of displaying an image may be used as the display panel DP. For example, the display panel DP may be an organic light-emitting display panel or a quantum dot light-emitting display panel. A light-emitting layer of the organic light-emitting display panel may include an organic light-emitting material. A light-emitting layer of the quantum dot light-emitting display panel may include quantum dots and the like. However, these are just exemplary and the types of display panels DP according to the invention are not limited thereto.

The display device DD of an embodiment may further include a support member SP. The support member SP may be disposed adjacent to the heat radiating member PH. The support member SP may be disposed below and/or above the heat radiating member PH. FIG. 2 illustrates a case that the support member SP is disposed below the heat radiating member PH, but the embodiment of the inventive concept is not limited thereto. In another embodiment, for example, the support member SP may be disposed above the heat radiating member PH. In still another embodiment, the support member SP may be disposed both below and above the heat radiating member PH.

The support member SP may have thermal diffusion and heat absorption characteristics. According to an embodiment, the support member SP may include at least one of copper or graphite. For example, the support member SP may include copper. The support member SP may include graphite. Furthermore, the support member SP may include both copper and graphite. However, these are just exemplary, and materials included in the support member SP according to the invention are not limited thereto. The support member SP may include another material having excellent thermal conductivity. The heat radiating member PH may be provided as a coating layer on the support member SP. A material forming the heat radiating member PH may be coated on the support member SP. Bismuth (Bi) may be coated on one surface of the support member SP. However, this is exemplary, and the heat radiating member PH may be provided as a separate layer, not as a coating layer.

On a plane defined by a first direction axis DR1 and a second direction axis DR2, the area of the heat radiating member PH may be substantially the same as the area of the display panel DP. The heat radiating member PH and the display panel DP may be completely overlapped in a plan view. However, the embodiment of the inventive concept is not limited thereto, and the area of the heat radiating member PH may be different from the area of the display panel DP.

The heat radiating member PH of an embodiment may be composed of bismuth. The heat radiating member PH may include a single material. That is, the heat radiating member PH may be formed of only bismuth. Bismuth (Bi) may have different properties depending on the length thereof. The length may be extended in one direction. For example, the length of Bismuth may be extended in a direction parallel to the first direction axis DR1, the second direction axis DR2, or the third direction axis DR3. Bismuth with a length of less than about 40 nm may have a semi-conductivity. Bismuth having a semi-conductivity may have a characteristic of facilitating electron movement. Bismuth having a length of more than about 40 nm may have a semi-metallic property. Bismuth having a semi-metallic property enables phonon movement, and may thus have a good thermal diffusion characteristic.

According to an embodiment of the inventive concept, the average thickness Z0 of the heat radiating member PH along the third direction axis DR3 may be about 25 nm or more and less than about 40 nm. The heat radiating member PH having a thickness of about 25 nm or more and less than about 40 nm may have a characteristic which enables electrons to move in a thickness direction (i.e., the third direction axis DR3). As used herein, the "thickness direction" is defined as a direction perpendicular to a major surface plane (plane defined by the first direction axis DR1 and the second direction axis DR2) of the heat radiating member. When the thickness of the heat radiating member composed of bismuth is less than about 25 nm, it may not be easy for the electrons to move in the thickness direction of the heat radiating member. Since the heat radiating member is thin, it may not be easy for the electrons to move in the thickness direction of the heat radiating member. Furthermore, when the thickness of the heat radiating member composed of bismuth is more than about 40 nm, it may not be easy for the electrons to move due to thermal diffusion. When it is possible for the electrons to move in the thickness direction (i.e., the third direction axis DR3) of the heat radiating member PH, thermal energy may be utilized as electrical energy by using a thermoelectric effect. By using a difference in temperature between the upper surface of the heat radiating member PH adjacent to the display panel DP and the lower surface of the heat radiating member PH adjacent to the housing HAU, thermal energy may be utilized as electrical energy.

A display device having many components built therein generates heat. More specifically, a display panel included in a display device generates heat. The heat generated in the display panel degrades the life and performance of the display device. Thus, a heat radiating member is used to diffuse or discharge the heat generated in the display panel. As the heat radiating member becomes thicker, the heat radiating member may more easily absorb the heat generated in the display panel. When the heat radiating member is made thick to improve heat absorption performance, high costs are required. When heat is not transferred smoothly on the surface of a heat radiating component adjacent to the outside of the display device, an increase in the operating period of the display device may cause the heat to be accumulated in the heat radiating member. When the heat is accumulated in the heat radiating member, the heat radiating member and the display panel may be in a state of thermal equilibrium.

A heat radiating member PH, PH-a, PH-b of an embodiment may be composed of bismuth and have a nanometer-scale length in the thickness direction. Accordingly, the heat radiating member PH, PH-a, PH-b of an embodiment may have a good thermal diffusion characteristic on a plane defined by the first direction axis DR1 and the second direction axis DR2. The heat radiating member PH, PH-a, PH-b of an embodiment may evenly diffuse heat on a plane and have an improved thermal diffusion speed thereof. The plane of the heat radiating member PH, PH-a, PH-b may be parallel to a plane defined by the first direction axis DR1 and the second direction axis DR2. The heat radiating member PH, PH-a, PH-b of an embodiment, in which separation distances between a plurality of holes HE, HE-a, HE-b are more than about 40 nm and equal to or less than about 150 nm, may have a good thermal diffusion characteristic on a plane perpendicular to the thickness direction. The heat radiating member PH, PH-a, PH-b of an embodiment may be also capable of diffusing heat in the thickness direction (i.e., the third direction axis DR3). However, the thermal diffusion of the heat radiating member PH, PH-a, PH-b of an embodiment in a direction parallel to a plane perpendicular to the thickness direction may be relatively better than the thermal diffusion thereof in the thickness direction.

Also, since the heat radiating member PH, PH-a, PH-b of an embodiment, having a thickness Z0 of about 25 nm or more and less than about 40 nm, enable electrons to move in the thickness direction, absorbed thermal energy may be used as electrical energy. The heat radiating member PH, PH-a, PH-b of an embodiment may utilize the absorbed thermal energy as electrical energy by using a thermoelectric effect. For example, the thermal energy may be utilized as electrical energy which may be used as the driving power of a battery included in a display device. However, this is exemplary, and the utilization of electrical energy according to the invention is not limited thereto.

The heat radiating member PH, PH-a, PH-b of an embodiment may define a plurality of holes HE, HE-a, HE-b defined therein. For example, the heat radiating member PH, PH-a, PH-b may be manufactured by providing a heat radiating member composed of bismuth and irradiating, with a laser beam, regions that may correspond to the holes HE, HE-a, HE-b. Alternatively, the heat radiating member PH, PH-a, PH-b may be manufactured by providing a mask in regions corresponding to the holes HE, HE-a, HE-b, and vapor-depositing bismuth to the heat radiating member. However, this is exemplary, and the method of making the heat radiating member PH, PH-a, PH-b according to the invention is not limited thereto.

According to an embodiment of the inventive concept, the area of the plurality of holes HE, HE-a, HE-b may be about 14 percentages (%) or more and less than about 40% of the total area of the heat radiating member PH, PH-a, PH-b including the plurality of holes HE, HE-a, HE-b. The total area of the heat radiating member PH, PH-a, PH-b may be parallel to a plane defined by a first direction axis DR1 and a second direction axis DR2. The area of the heat radiating member PH, PH-a, PH-b excluding the plurality of holes HE, HE-a, HE-b may be about 60% or more and less than about 86% of the total area of the heat radiating member PH, PH-a, PH-b.

The plurality of holes HE, HE-a, HE-b may be separated from each other on a plane defined by the first direction axis DR1 and the second direction axis DR2. The plurality of holes HE may be separated from each other on a plane defined by the first direction axis DR1 and the second direction axis DR2 crossing the first direction axis DR1. A separation distance L0 between adjacent holes among the plurality of holes HE, HE-a, HE-b may be more than about 40 nm and equal to or less than about 150 nm. The separation distance L0 may be a linear distance between adjacent holes HE on a plane and may be a distance between the edges of the respective adjacent holes HE. In this specification, the separation distance L0 may be defined as a minimum separation distance between adjacent holes. That is, the separation distance may mean the shortest linear distance between an edge of a hole and an edge of another hole adjacent thereto.

According to an embodiment of the inventive concept, each of a plurality of holes HE, HE-a, HE-b may have a circular or polygonal shape. FIG. 4 illustrates that a plurality of holes HE has a circular shape, and FIG. 5 illustrates that a plurality of holes HE-a have a quadrilateral shape. Unlike the embodiment in FIG. 5, FIG. 6 illustrates that a plurality of holes HE-b have a hexagonal shape. However, these are exemplary and the shapes of holes defined in the heat radiating member of an embodiment are not limited thereto.

Since air circulation is improved due to the plurality of holes HE, HE-a, HE-b defined in the heat radiating member PH, PH-a, PH-b, the heat radiating member PH, PH-a, PH-b of an embodiment may have an improved thermal diffusion characteristic. When separation distances L0 between the plurality of holes on a plane are less than about 40 nm, the semi-conductivity of the heat radiating member PH, PH-a, PH-b is stronger than the semi-metallic property thereof, so that the thermal diffusion characteristic of the heat radiating member PH, PH-a, PH-b is degraded. In addition, when separation distances between the plurality of holes each are more than about 150 nm, the thermal diffusion characteristic may be degraded due to a decrease in the number of holes HE, HE-a, HE-b defined in the heat radiating member PH, PH-a, PH-b. A separation distance between adjacent holes among the plurality of holes HE, HE-a, HE-b defined in the heat radiating member PH, PH-a, PH-b may be more than about 40 nm and equal to or less than about 150 nm. Accordingly, heat generated from the display panel DP and absorbed into the heat radiating member PH, PH-a, PH-b may be easily diffused on the plane of the heat radiating member PH, PH-a, PH-b.

Referring to FIG. 4, the plurality of holes HE may include first to third adjacent holes HE1, HE2, HE3. FIG. 4 illustrates that the plurality of holes HE each has a circular shape with the same diameter, but the embodiment of the inventive concept is not limited thereto. According to an embodiment of the inventive concept, when the plurality of holes HE each has a circular shape, the average diameters of the holes HE may be different from each other. The diameters of adjacent holes among the plurality of holes HE may be different from each other. In addition, FIGS. 2 and 4 illustrate circular holes HE having one diameter, but the embodiment of the inventive concept is not limited thereto. In another embodiment, the plurality of holes may be oval with two diameters. When the plurality of holes is oval, the sizes of the respective holes may be different from each other. Separation distances between first to third holes HE1, HE2, HE3 each may be more than about 40 nm and equal to or less than about 150 nm. In FIG. 4, a separation distance L1 between the first hole HE1 and the second hole HE2 may be parallel to the direction in which the first direction axis DR1 extends. The separation distance L1 between the first hole HE1 and the second hole HE2 may be more than about 40 nm and equal to or less than about 150 nm. In FIG. 4, a separation distance L2 between the first hole HE1 and the third hole HE3 may be parallel to the direction in which the second direction axis DR2 extends. The separation distance L2 between the first hole HE1 and the third hole HE3 may be more than about 40 nm and equal to or less than about 150 nm. A separation distance L3 between the second hole HE2 and the third hole HE3 may be more than about 40 nm and equal to or less than about 150 nm.

In an embodiment, for example, the separation distance L1 between the first hole HE1 and the second hole HE2 may be different from the separation distance L2 between the first hole HE1 and the third hole HE3. The separation distance L1 between the first hole HE1 and the second hole HE2 may be different from the separation distance L3 between the second hole HE2 and the third hole HE3. The separation distance L2 between the first hole HE1 and the third hole HE3 may be different from the separation distance L3 between the second hole HE2 and the third hole HE3.

In another embodiment, the separation distance L1 between the first hole HE1 and the second hole HE2 may be the same as the separation distance L2 between the first hole HE1 and the third hole HE3. The separation distance L1 between the first hole HE1 and the second hole HE2 may be the same as the separation distance L3 between the second hole HE2 and the third hole HE3. The separation distance L2 between the first hole HE1 and the third hole HE3 may be the same as the separation distance L3 between the second hole HE2 and the third hole HE3.

FIG. 5 illustrates that a plurality of holes HE-a each has a quadrilateral shape with the same size. Each of the plurality of holes HE-a may have a square shape, in which the sides forming a quadrilateral shape are the same in length (i.e., square). However, the embodiment of the inventive concept is not limited thereto. In another embodiment, the plurality of holes HE-a may have quadrilateral shapes having different sizes. The quadrilaterals of adjacent holes among the plurality of holes HE-a may be different in size.

In addition, as illustrated in FIG. 5, separation distances between the plurality of holes HE-a may be different, as described in FIG. 4, even when the plurality of holes HE-a have a quadrilateral shape. In another embodiment, separation distances between the plurality of holes HE-a may be the same.

Referring to FIG. 6, a plurality of holes HE-b may include fourth to sixth holes HE-b4, HE-b5, HE-b6. Each of the fourth to sixth holes HE-b4, HE-b5, HE-b6 may have a hexagonal shape. The plurality of holes HE-b may each have a regular hexagonal shape, in which the sides forming a hexagon are the same in length. Each of the fourth to sixth holes HE-b4, HE-b5, HE-b6 may be a regular hexagon. Separation distances L4, L5, L6 between the fourth to sixth holes HE-b4, HE-b5, HE-b6 may be more than about 40 nm and equal to or less than about 150 nm. The direction measuring the separation distance L4 between the fourth hole HE-b4 and the fifth hole HE-b5 may be parallel to the direction in which the second direction axis DR2 extends. The separation distance L4 between the fourth hole HE-b4 and the fifth hole HE-b5 may be more than about 40 nm and equal to or less than about 150 nm. The separation distance L5 between the fourth hole HE-b4 and the sixth hole HE-b6 may be more than about 40 nm and equal to or less than about 150 nm. The direction measuring the separation distance L6 between the fifth hole HE-b5 and the sixth hole HE-b6 may be parallel to the direction in which the first direction axis DR1 extends. The separation distance L6 between the fifth hole HE-b5 and the sixth hole HE-b6 may be more than about 40 nm and equal to or less than about 150 nm.

In an embodiment, for example, the separation distance L4 between the fourth hole HE-b4 and the fifth hole HE-b5 may be different from the separation distance L6 between the fifth hole HE-b5 and the sixth hole HE-b6. The separation distance L4 between the fourth hole HE-b4 and the fifth hole HE-b5 may be different from the separation distance L5 between the fourth hole HE-b4 and the sixth hole HE-b6. The separation distance L5 between the fourth hole HE-b4 and the sixth hole HE-b6 may be different from the separation distance L6 between the fifth hole HE-b5 and the sixth hole HE-b6. In another embodiment, the separation distance L4 between the fourth hole HE-b4 and the fifth hole HE-b5 may be the same as the separation distance L6 between the fifth hole HE-b5 and the sixth hole HE-b6.

According to an embodiment of the inventive concept, when a plurality of holes each has a regular hexagonal shape, distances between the center points of adjacent holes on a plane may be the same. The center points may be virtual points passing through the centers of the plurality of holes, respectively. FIG. 6 illustrates a point P1, a point P2, and a point P3. The point P1 represents a point having the same distance from the six vertexes of the hexagon in which the point P1 is positioned. The point P2 represents a point having the same distance from the six vertexes of the hexagon in which the point P2 is positioned. The point P3 represents a point having the same distance from the six vertexes of the hexagon in which the point P3 is positioned.

A distance LL1 between the point P1 and the point P2 may be the same as a distance LL2 between the point P2 and the point P3. The distance LL1 between the point P1 and the point P2 may be the same as a distance LL3 between the point P1 and the point P3. The distance LL2 between the point P2 and the point P3 may be the same as the distance LL3 between the point P1 and the point P3. In addition, the distance LL1 between the point P1 and the point P2, the distance LL2 between the point P2 and the point P3, and the distance LL3 between the point P1 and the point P3 may be all the same.

Referring to FIGS. 4 to 6, a plurality of holes HE, HE-a, HE-b may be defined to penetrate a heat radiating member PH, PH-a, PH-b. The plurality of holes HE (FIG. 4) may be provided to have a cylindrical shape through the heat radiating member PH. The plurality of holes HE-a may be provided to have a square column shape passing through the heat radiating member PH-a. In addition, the plurality of holes HE-b may be provided to have a hexagonal column shape passing through the heat radiating member PH-b. However, these are exemplary, and the shapes of holes defined to penetrate the heat radiating member of an embodiment are not limited thereto.

The plurality of holes HE, HE-a, HE-b is defined in the heat radiating member PH, PH-a, PH-b of an embodiment, and the plurality of holes HE, HE-a, HE-b may be separated from each other on a plane (i.e., in a plan view). Separation distances L1 to L3, L4 to L6 between the plurality of holes HE, HE-a, HE-b each may be more than about 40 nm and equal to or less than about 150 nm.

Figure 7:
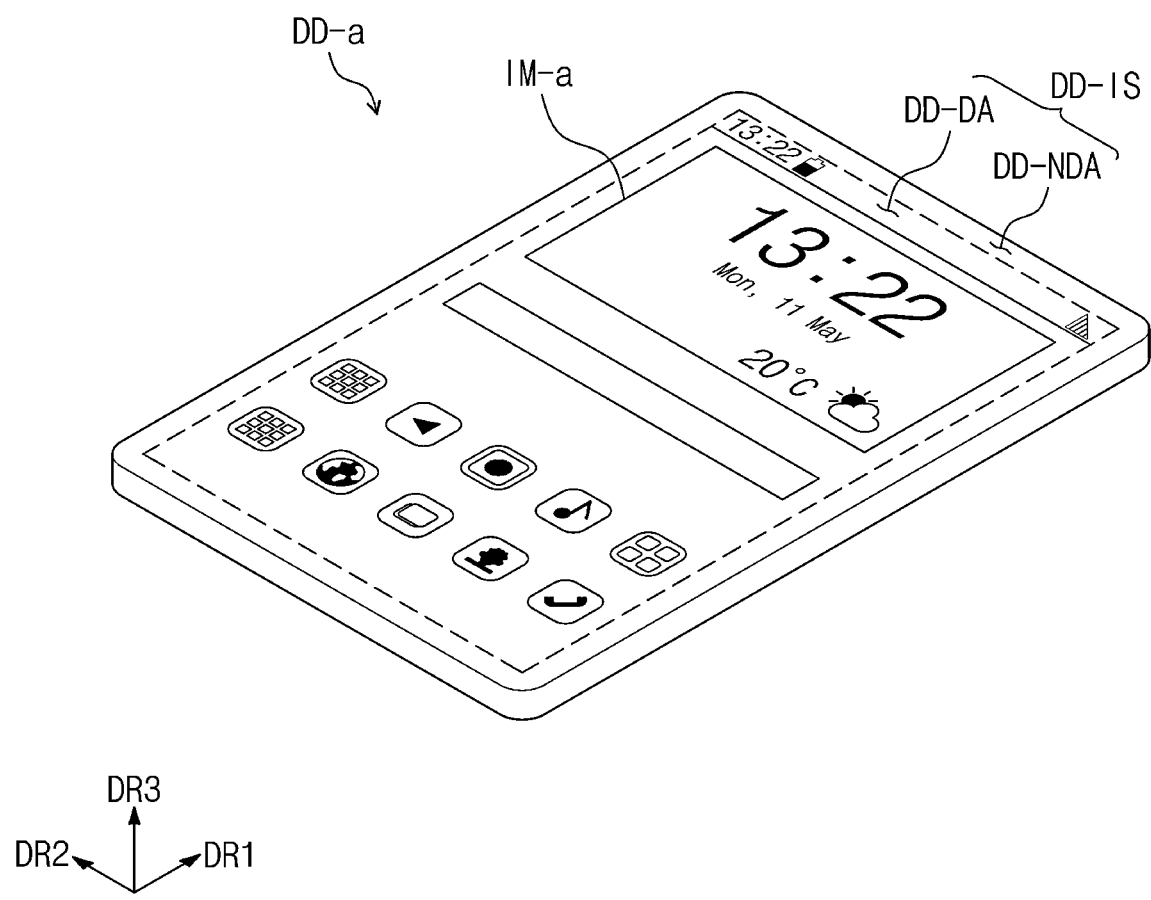
FIG. 7 is a perspective view illustrating a display device of one embodiment.
Figure 8A:
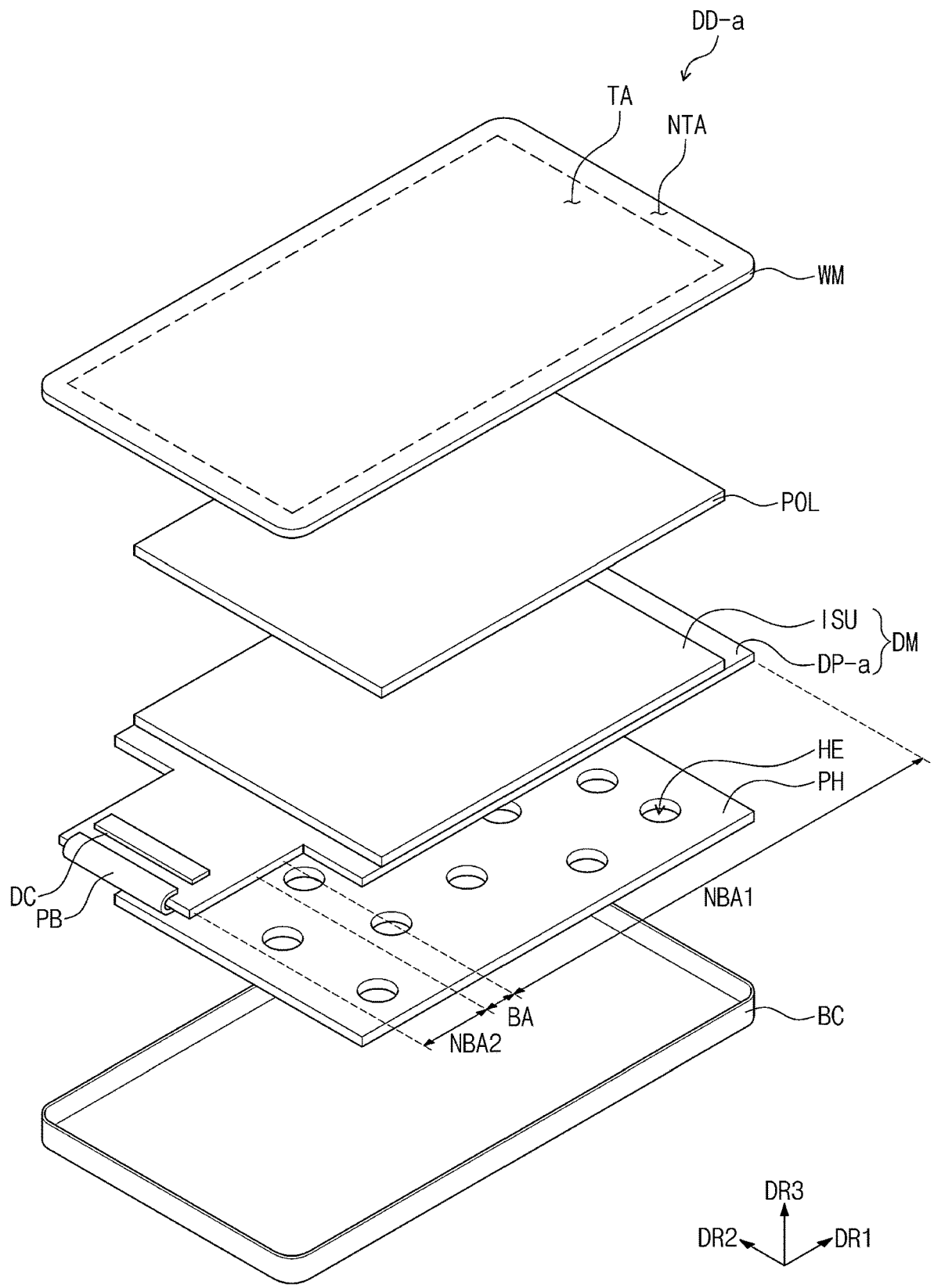
FIG. 8A is an exploded perspective view illustrating a display device of one embodiment.
Figure 8B:
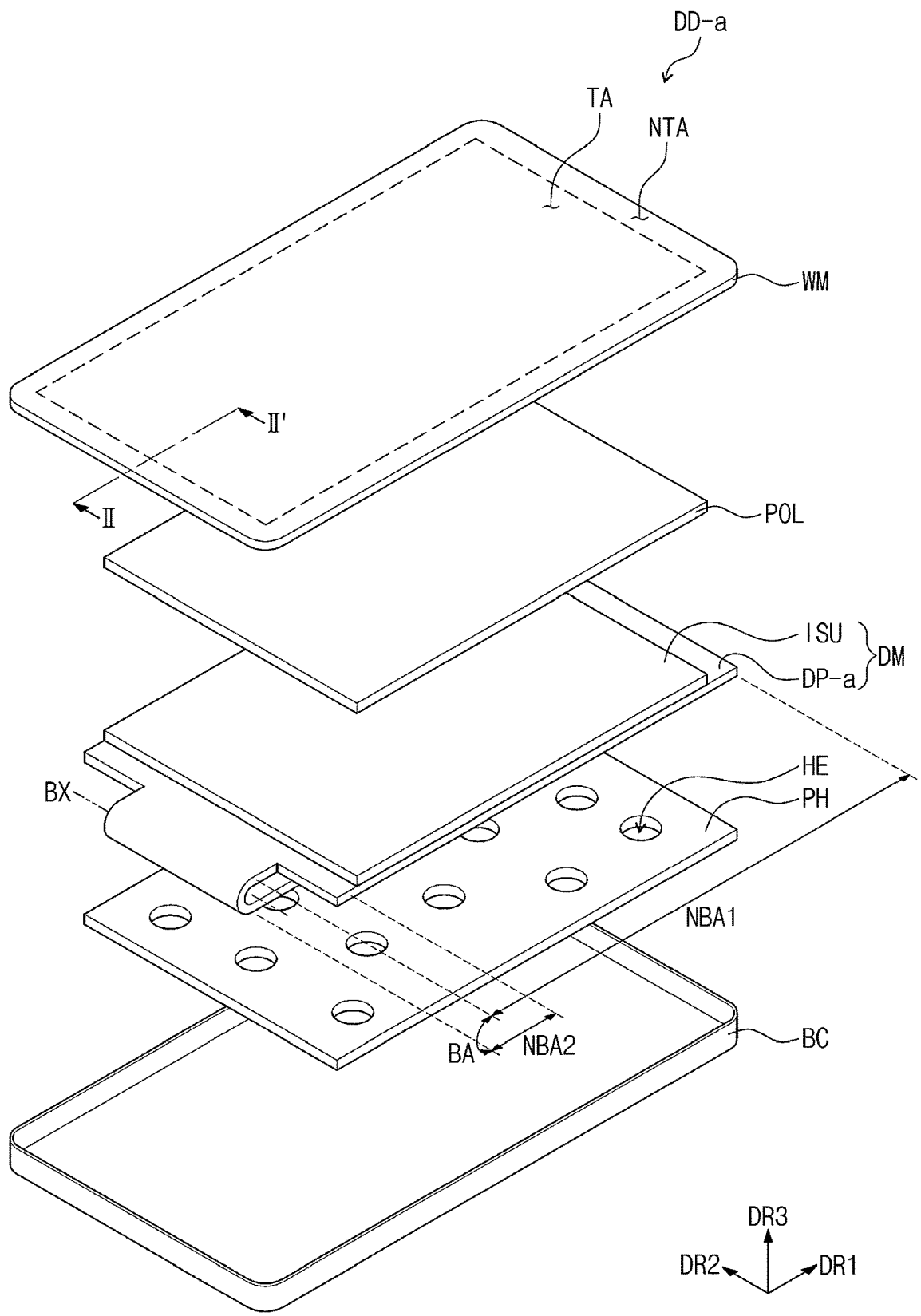
FIG. 8B is an exploded perspective view illustrating a display device of one embodiment.
Figure 9:
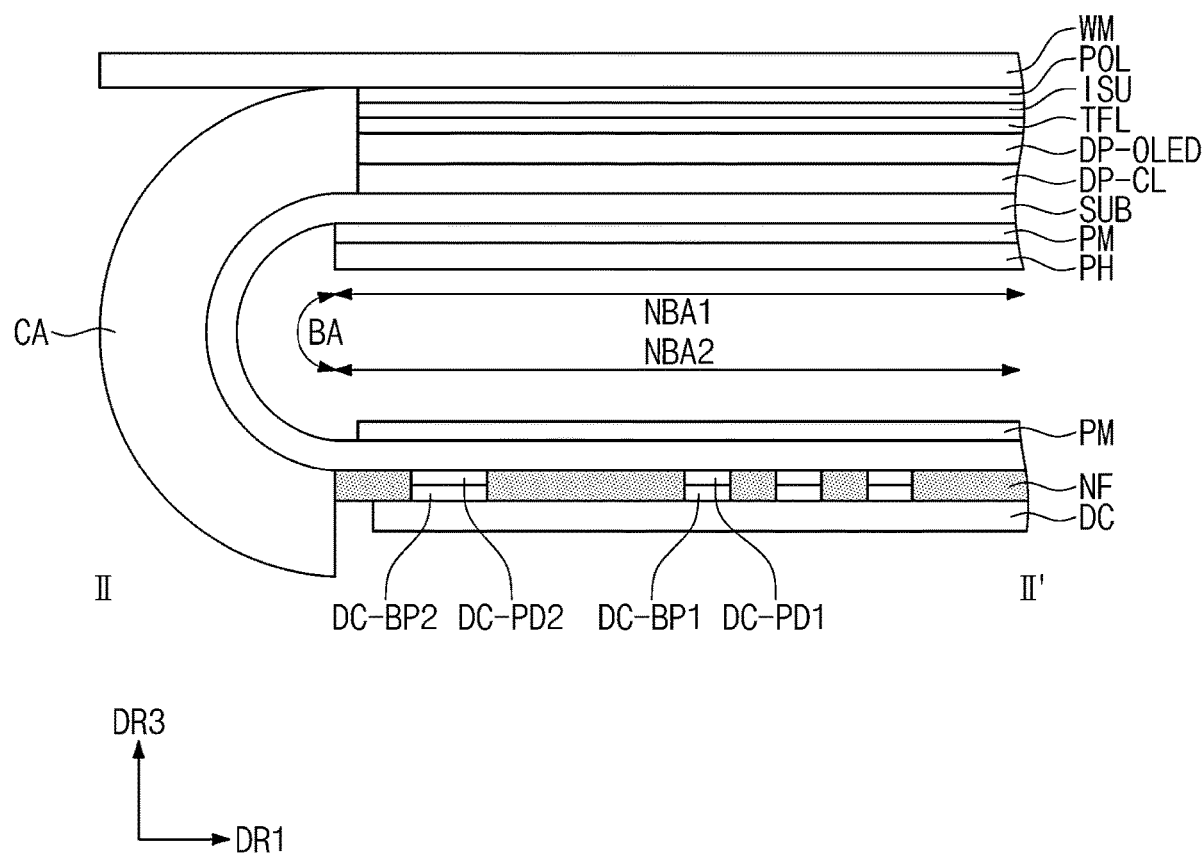
FIG. 9 is a cross-sectional view illustrating a portion taken along line II-IF of FIG. 8B.

FIGS. 7 to 9 illustrate embodiments of the inventive concept. The same contents as the heat radiating member PH, PH-a, PH-b described with reference to FIGS. 2 to 6 may be applied to the heat radiating member illustrated in FIGS. 8A to 9

FIG. 7 illustrates a display device DD-a of an embodiment. Unlike FIG. 1, FIG. 7 illustrates a smart phone. FIGS. 8A and 8B are exploded perspective views of the display device DD-a illustrated in FIG. 7. FIG. 9 illustrates a portion taken along line II-IF of FIG. 8B. More specifically, FIG. 9 illustrates a portion taken along line II-II' of FIG. 8B as a result of joining the components in FIG. 8B.

Referring to FIG. 7, the display device DD-a of an embodiment may display an image IM-a through a display surface DD-IS. The display surface DD-IS may include a display area DD-DA, where an image IM-a is displayed, and a non-display area DD-NDA adjacent to the display area DD-DA. The non-display area DD-NDA is an area where an image is not displayed. However, the embodiment of the inventive concept is not limited thereto, and the non-display area DD-NDA may be omitted.

Referring to FIGS. 8A and 8B, the display device DD-a may include a window WM, an optical layer POL, a display module DM, a heat radiating member PH, and a storage member BC. The display module DM may include a display panel DP-a and an input sensing layer ISU disposed on the display panel DP-a. An electronic component DC may be disposed on one surface of the display panel DP-a, and the electronic component DC may be a driving chip. In addition, a circuit board PB may be disposed adjacent to the electronic component DC. The circuit board PB may include a timing control circuit for controlling the operation of the display panel DP-a. The circuit board PB may include an input sensing circuit for controlling the input sensing layer ISU.

The storage member BC may house the display module DM and may be coupled with the window WM. For example, the optical layer POL may include a polarizing layer or a color filter layer. However, the embodiment of the inventive concept is not limited thereto, and the optical layer POL may be omitted in the display device DD-a of an embodiment.

The window WM is disposed above the display module DM and may transmit, to the outside, an image provided from the display module DM. The window WM may include a transmission area TA and a non-transmission area NTA. The transmission area TA may overlap the display area DD-DA in a plan view and have a shape which corresponds to the display area DD-DA.

An image IM-a displayed in the display area DD-DA of the display device DD-a may be visually recognized from the outside through the transmission area TA of the window WM. The non-transmission area NTA may overlap the non-display area DD-NDA of the display device DD-a in a plan view and have a shape which corresponds to the non-display area DD-NDA thereof. The light transmittance of the non-transmission area NTA is relatively lower than that of the transmission area TA. However, the embodiment of the inventive concept is not limited thereto, and the non-transmission area NTA may be omitted.

The display module DM is disposed between the window WM and the storage member BC. The display module DM may include the display panel DP-a and the input sensing layer ISU.

The input sensing layer ISU may be disposed between the window WM and the display panel DP-a. The input sensing layer ISU senses an input applied from the outside. The input applied from the outside may be provided in various forms. For example, an external input may include various types of external inputs such as a part of a user's body, a stylus pen, light, heat, or pressure.

The display panel DP-a may include a first non-bending part NBA1, a second non-bending part NBA2, and a bending part BA. The bending part BA may be disposed between the first non-bending part NBA1 and the second non-bending part NBA2. The width of each of the bending part BA and the second non-bending part NBA2 may be smaller than the maximum width of the first non-bending part NBA1. The maximum width of the first non-bending part NBA1, the width of the bending part BA, and the width of the second non-bending part NBA2 may be parallel to the direction in which the second direction axis DR2 extends.

Unlike FIG. 8A, FIG. 8B illustrates the display panel DP-a in a bent state. When the display panel DP-a is in a bent state, the second non-bending part NBA2 may overlap the first non-bending part NBA1 in a plan view. The bending part BA may be bent along the bending axis BX which is parallel to the direction in which the second direction axis DR2 extends. The display panel DP-a may be housed in the storage member BC in a bent state.

In FIGS. 8A and 8B, the adhesive layer AD (see FIG. 2) may be omitted between the heat radiating member PH and the display module DM. The heat radiating member PH and the display module DM may be joined by the adhesive layer.

Referring to FIG. 9, a circuit layer DP-CL, a display element layer DP-OLED, and an encapsulation layer TFL may be sequentially stacked on a substrate. The display panel DP-a may include a circuit layer DP-CL, a display element layer DP-OLED, and an encapsulation layer TFL. The input sensing layer ISU may be disposed on the encapsulation layer TFL, and the optical layer POL and the window WM may be disposed on the input sensing layer ISU.

A protective film PM may be disposed below the substrate SUB. The protective film PM may be provided between the substrate SUB and the heat radiating member PH. The protective film PM may be in direct contact with the lower surface of the substrate.

A coating layer CA may be disposed on the upper surface of the substrate SUB. The coating layer CA may overlap the bending part BA. In addition, a part of the coating layer CA may overlap the non-bending part NBA1. However, these are just exemplary, the coating layer CA may not overlap the non-bending part NBA1, NBA2. When the display panel DP-a is bent, the coating layer CA allows the display panel DP-a to be easily bent and prevents damage to the display panel DP-a.

In addition, an electronic component DC may be disposed on one surface of the substrate SUB. The electronic component DC may be disposed below the substrate SUB when the display panel DP-a (See FIG. 8B) is bent. The electronic component DC may be joined to the substrate SUB by the sub-adhesive layer NF. The sub-adhesive layer NF may be non-conductive. Bumps DC-BP1, DC-BP2 and pads DC-PD1, DC-PD2 may be disposed on the electronic component DC. First bumps DC-BP1 may correspond to first pads DC-PD1, and second bumps DC-BP2 may correspond to second pads DC-PD2.

The heat radiating member PH of an embodiment may be disposed below the display panel DP-a. The heat radiating member PH may be disposed below the substrate SUB. According to an embodiment of the inventive concept, the heat radiating member PH may overlap the first non-bending part NBA1 and may not overlap the bending part BA in a plan view. The heat radiating member PH may define a plurality of holes HE therein. In a plan view, separation distances between the plurality of holes HE may be more than about 40 nm and equal to or less than about 150 nm. Besides, the thickness of the heat radiating member PH may be about 25 nm to about 40 nm.

Referring to the literature titled "Diameter-dependent thermoelectric figure of merit in single-crystalline Bi nanowires", it can be known that the carrier concentration of a bismuth nanowire having a diameter of about 21 nm to about 27 nm is higher than that of bismuth bulk and that the bismuth nanowire exhibits metallic behavior. It can be also known that the bismuth nanowire having a diameter of more than about 100 nm exhibits resistivity close to that of the bismuth bulk. In addition, it can be known that the Seebeck coefficient of bismuth changes at the reference point of about 40 nm.

Figure 10:
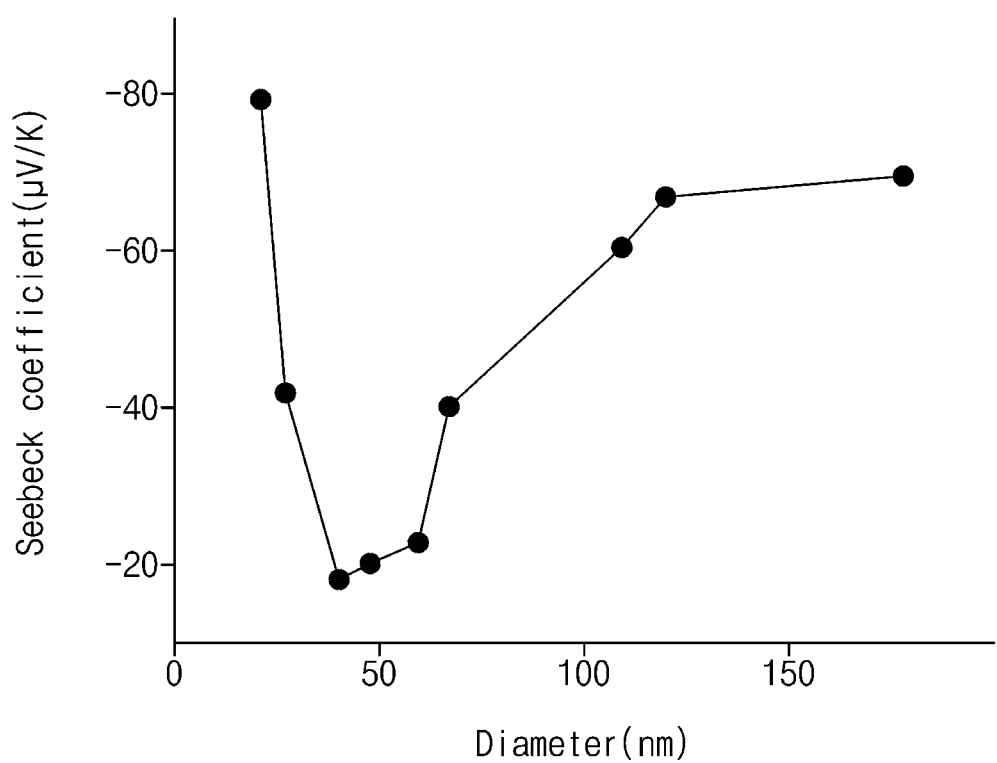
FIG. 10 is a graph illustrating Seebeck coefficients in accordance with the diameters of bismuth.

FIG. 10 is a graph illustrating Seebeck coefficients (unit: microvolts per kelvin ($\mu$V/K)) versus diameters (unit: nm) of bismuth nanowires at a temperature of 300K. Referring to FIG. 10, it can be seen that the patterns of Seebeck coefficients of bismuth change at the reference point of about 40 nm in diameter. When the diameter is less than about 40 nm, it can be seen that the absolute value of a Seebeck coefficient decreases as the diameter increases. When the diameter is more than about 40 nm, it can be seen that the absolute value of a Seebeck coefficient increases as the diameter increases. As a Seebeck coefficient increases, phonon mobility may be improved. When the diameter is less than about 40 nm, as the diameter increases, the absolute value of a Seebeck coefficient decreases, phonon movement is reduced, and mainly electrons may move. When the diameter is more than about 40 nm, as the diameter increases, the absolute value of a Seebeck coefficient increases and phonon movement may increase. Phonon is a factor that affects the diffusion of heat. Therefore, as phonon movement increases, the degree of heat diffusion may increase.

Accordingly, the heat radiating member of an embodiment including bismuth has a thickness of about 25 nm or more and less than about 40 nm and may have a semi-conductivity which enables electrons to move in a thickness direction. In addition, the separation distances between the holes in a plan view in the heat radiating member of an embodiment including bismuth are more than about 40 nm and equal to or less than about 150 nm and may have a good thermal diffusion characteristic.

The heat radiating member of an embodiment may be composed of bismuth and define a plurality of holes therein. The separation distances between the plurality of holes in a plan view may be more than about 40 nm and equal to or less than about 150 nm. Accordingly, the heat radiating member of an embodiment in which a plurality of holes is defined may diffuse heat evenly on a plane and have a characteristic in which a thermal diffusion speed is improved. Moreover, the average thickness of the heat radiating member of an embodiment may be about 25 nm or more and less than about 40 nm. The heat radiating member having a thickness of about 25 nm or more and less than about 40 nm may have a characteristic which enables electrons to move in a thickness direction. Since it is possible for the electrons to move in the thickness direction of the heat radiating member, thermal energy absorbed from the display panel may be utilized as electrical energy.

A display device of an embodiment, including the heat radiating member of an embodiment, may diffuse heat evenly on a plane and have a characteristic in which a thermal diffusion speed is improved. In addition, the display device of an embodiment may utilize the thermal energy, absorbed from the display panel into the heat radiating member, as electrical energy.

Since the heat radiating member of an embodiment is composed of bismuth and has a nanometer-scale length, the heat radiating member may be excellent in thermal diffusion characteristic and electron transfer characteristic.

As the display device of an embodiment includes a heat radiating member which is composed of bismuth and has a nanometer-scale length, the display device may be excellent in thermal diffusion characteristic and electron transfer characteristic.

Although the above has been described with reference to preferred embodiments of the inventive concept, those skilled in the art or those of ordinary skill in the art will understand that various modifications and changes can be made to the present invention within the scope that does not depart from the spirit and technical area of the present invention described in the claims to be described later.

Accordingly, the technical scope of the present invention should not be limited to the content described in the detailed description of the specification, but should be determined by the claims as hereinafter described.

What is claimed is:

1. A heat radiating member comprising bismuth, wherein each of separation distances, in a plan view, between adjacent holes among a plurality of holes defined in the heat radiating member and separated from each other is more than about 40 nanometers (nm) and equal to or less than about 150 nm,
wherein the heat radiating member has an average thickness of about 25 nm or more and less than about 40 nm in a thickness direction.

2. The heat radiating member of claim 1, wherein each of the plurality of holes has, in the plan view, a circular or polygonal shape.

3. The heat radiating member of claim 2, wherein the plurality of holes each has, in the plan view, a circular shape, and has an average diameter different from each other.

4. The heat radiating member of claim 2, wherein each of the plurality of holes has, in the plan view, a quadrilateral shape, and sizes of the plurality of holes are different from each other.

5. The heat radiating member of claim 2, wherein each of the plurality of holes has, in the plan view, a regular hexagonal shape,
distances between center points of the adjacent holes in the plan view are the same, and
the center points are virtual points passing through centers of the adjacent holes, respectively.

6. The heat radiating member of claim 1, wherein the separation distances between the adjacent holes among the plurality of holes are different from each other.

7. The heat radiating member of claim 1, wherein a total area of the plurality of holes is about 14 percentages (%) or more and less than about 40% of a total area of the heat radiating member including the plurality of holes in the plan view.

8. A display device comprising:
a display panel; and
a heat radiating member disposed below the display panel, comprising bismuth and defining a plurality of holes therein which are separated from each other,
wherein separation distances between adjacent holes among the plurality of holes in a plan view each are more than about 40 nm and equal to or less than about 150 nm,
wherein an average thickness of the heat radiating member in a thickness direction is about 25 nm or more and less than about 40 nm.

9. The display device of claim 8, wherein the plurality of holes each has a cylindrical or polygonal-columnar shape, and each of the plurality of holes is defined to pass through the heat radiating member.

10. The display device of claim 8, wherein each of the plurality of holes has, in the plan view, a circular or polygonal shape.

11. The display device of claim 10, wherein each of the plurality of holes has a regular hexagonal shape in the plan view,
distances between center points of the adjacent holes in the plan view are the same, and
the center points are virtual points passing through centers of the adjacent holes, respectively.

12. The display device of claim 8, wherein the separation distances between the adjacent holes among the plurality of holes are different from each other.

13. The display device of claim 8, further comprising a support member disposed below the display panel, wherein the support member includes at least one of copper or graphite.

14. The display device of claim 13, wherein the support member is disposed below or both below and above the heat radiating member.

15. The display device of claim 8, wherein the display panel includes a bending part and a non-bending part, and the heat radiating member overlaps the non-bending part and does not overlap the bending part in the plan view.

16. The display device of claim 8, wherein an area of the display panel and an area of the heat radiating member including the plurality of holes in the plan view are the same.

17. The display device of claim 8, further comprising an adhesive layer disposed between the display panel and the heat radiating member.

18. The display device of claim 17, wherein the adhesive layer contains epoxy, acrylate, or silicone.

\* \* \* \* \*